United States Patent
Gover et al.

(10) Patent No.: US 6,522,989 B1
(45) Date of Patent: Feb. 18, 2003

(54) SYSTEM AND METHOD FOR TIMING ANALYSIS OF AN INTEGRATED CIRCUIT CLOCKED BY MIXED CLOCK TYPES

(75) Inventors: John Gover, Fort Collins, CO (US); Charles Corey Pie', Ft. Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/515,446

(22) Filed: Feb. 29, 2000

(51) Int. Cl.[7] .................. G01M 19/00; G06F 19/00
(52) U.S. Cl. ..................... 702/126; 702/124; 716/6
(58) Field of Search ............................. 702/58, 66, 69, 702/79, 89, 124, 125, 176–178, 187; 327/31; 716/6, 11; 364/528; 395/553, 551, 555

(56) References Cited

U.S. PATENT DOCUMENTS

| | | | | |
|---|---|---|---|---|
| 5,761,097 A | * | 6/1998 | Palermo | 364/569 |
| 5,771,375 A | * | 6/1998 | Mains | 395/558 |
| 6,349,267 B1 | * | 2/2002 | Goldthorp et al. | 702/69 |

* cited by examiner

*Primary Examiner*—Marc S. Hoff
*Assistant Examiner*—Mary Catherine Baran

(57) ABSTRACT

A system and method for static timing analysis of an integrated circuit which is clocked via various clock signals, including phase-type and pulse-type clocks. Based upon characteristics of the clocks in relation to a reference clock signal, a timing budget and window duration are determined by reference to a look up table.

26 Claims, 8 Drawing Sheets

| ROW/COLUMN | INPUT | | | | CORRELATING TIMING OCCURENCES | | | | OUTPUT | |
|---|---|---|---|---|---|---|---|---|---|---|
| | I (41) Driver Opens on (Edge) | II (42) Rec'r Opens on (Edge) | III (43) Rec'r Closes on (Edge) | IV (44) Driver-Receiver Relation | V Driver Opens on (Cycle) | VI Receiver Opens on Cycle) | VII Receiver Closes on (Cycle) | VIII TIMING Budget | IX WINDOW DURATION | X Default Ref. Edge |
| 1 | | | | | | | | | | |
| 2 | UP | UP | DOWN | OPPOSITE | 0 | 0 | 1 | 1 | 1 | same RF |
| 3 | UP | DOWN | UP | OPPOSITE | 0 | 2 | 3 | 3 | 1 | |
| | | | | | 0 | 1 | 2 | 2 | 1 | |
| 4 | UP | UP | UP | SAME | 0 | 0 | 0 | 0 | 0 | |
| 5 | UP | DOWN | DOWN | SAME | 0 | 2 | 2 | 2 | 0 | next RF |
| | | | | | 0 | 1 | 1 | 1 | 0 | |
| 6 | UP | UP | UP | NEXT | 0 | -2 | 0 | 0 | 2 | Next RF |
| 7 | UP | DOWN | DOWN | NEXT | 0 | 0 | 2 | 2 | 2 | |
| 8 | DOWN | DOWN | UP | OPPOSITE | 0 | -1 | 1 | 1 | 2 | same RF |
| 9 | DOWN | UP | DOWN | OPPOSITE | 1 | 1 | 2 | 1 | 1 | |
| | | | | | 1 | 3 | 4 | 3 | 1 | |
| | | | | | 1 | 2 | 3 | 2 | 1 | |
| 10 | DOWN | DOWN | DOWN | SAME | 1 | 1 | 1 | 0 | 0 | |
| 11 | DOWN | UP | UP | SAME | 1 | 3 | 3 | 2 | 0 | next RF |
| | | | | | 1 | 2 | 2 | 1 | 0 | |
| 12 | DOWN | DOWN | DOWN | NEXT | 1 | -1 | 1 | 0 | 2 | Next RF |
| 13 | DOWN | UP | UP | NEXT | 1 | 1 | 3 | 2 | 2 | |
| | | | | | 1 | 0 | 2 | 1 | 2 | |

FIG.6

| CLOCK TYPE | Driver or Receiver Opens on (Edge of Ref. Clock) | Driver or Receiver Closes on (Edge of Ref. Clock) | Relationship |
|---|---|---|---|
| CK | UP | DOWN | OPPOSITE |
| NCK | DOWN | UP | OPPOSITE |
| PCK | UP | UP | SAME |
| PNCK | DOWN | DOWN | SAME |
| NPCK | UP | UP | NEXT |
| NPNCK | DOWN | DOWN | NEXT |

SYSTEM AND METHOD FOR TIMING ANALYSIS OF AN INTEGRATED CIRCUIT CLOCKED BY MIXED CLOCK TYPES

TECHNICAL FIELD

The present invention is generally related to static timing analysis of integrated circuit design and, more particularly, to a system and method for specifying a timing budget and window duration to be applied to a signal path under evaluation. The present invention is applicable to integrated circuits in which different, as well as identical, clock-type combinations might be utilized to clock circuitry operations.

BACKGROUND OF THE INVENTION

Typical timing analysis tools are used in the analysis and design of integrated circuitry. These tools are useful in analyzing a signal path and determining whether or not, given a specified frequency of operation, the circuitry along that signal path is going to meet or exceed the timing requirements necessary for the proper circuitry operation at the specified frequency.

In the case where circuitry under analysis is provided a phase-type clock input signal, typical timing analysis tools are quite competent. However, where circuitry under analysis is being provided mixed clock-type signals, for example phase clock signals and pulse clock signals, these timing analysis tools are less reliable. More particularly, typical timing analysis tools are designed to analyze circuitry that is clocked via only phase-type clock signals. Thus, typical timing analysis tools are not equipped to competently handle circuitry that is clocked via pulse clock signals.

With typical static timing tools errors are often caused by clock signals which are not accurately interpreted. These "ambiguous" clock signals occur frequently where the signal path under evaluation includes circuitry which is clocked by multiple clocks, and more particularly, where there is a mix of both phase-type clocks and pulse type clocks used to clock circuit operations. The signal path under analysis is generally a series of latches that include a driver latch and a receiver latch. A driver latch is a latch whose output feeds an input of a receiver latch.

FIG. 1 shows an example of a phase clock signal (CK) 20 and a pulse clock signal (PCK) 22. It can be seen that phase clock signal 20 and pulse clock signal 22 each have a leading edge 40 and a trailing edge 41. Typical timing analysis tools are designed for use in analyzing circuitry incorporating phase clock signals that are used to clock circuit operations. Phase clock type signals have a trailing edge 41 that follows a leading edge 40 after a period of time has elapsed. Phase clock signals typically have a duty-cycle of approximately 50%. Unlike phase-type clock signals a pulse-type clock signal has a very limited duty cycle and essentially provides for only a very limited duration of time between the leading edge 40 and the trailing edge 41. Since typical timing analysis tools are optimized for circuitry which is clocked via a phase-type clock signal, many inaccuracies occur when these tools are applied to analyze circuitry incorporating pulse-type clock signals. In the case of circuitry that is clocked via a pulse-type clock signal, the clock behavior is not as expected by typical static timing analysis tools. Thus, the typical static timing analysis tools fall short of reliable analysis of circuitry in which mixed type clock signals are provided to the circuitry under analysis.

Thus, a heretofore unaddressed need exists in the industry to address the aforementioned deficiencies and inadequacies.

SUMMARY OF THE INVENTION

The present invention provides a system and method for static timing analysis of an integrated circuit. Briefly described, in architecture, the system can be implemented as follows. There is provided a sensor for determining whether the driver latch opens on an opening edge or a trailing edge of a reference clock, as well as a sensor for determining whether the receiver latch opens on a opening edge or a closing edge of the reference clock. Further a sensor for determining whether the receiver latch closes on an opening edge or a closing edge of the reference clock is provided, as is a sensor for determining the relation between the reference clock edge on which the receiving latch opens and the reference clock edge on which the receiving latch closes. A controller determines a timing budget based upon the determination (input) from each of the sensors.

The present invention can also be viewed as providing a method for static timing analysis of an integrated circuit. In this regard, the method can be broadly summarized by the following steps: identifying a signal path composed of a driver latch; logic gating and a receiver latch for evaluation; defining a reference clock having an opening edge and closing edge; determining whether the driver latch opens on an opening edge or a trailing edge of the reference clock; determining whether the receiver latch opens on an opening edge or a closing edge of the reference clock; determining whether the receiver latch closes on an opening edge or a closing edge of the reference clock; determining the relation between the reference clock edge on which the receiving latch opens and the reference clock edge on which the receiving latch closes; and assigning a timing budget based upon the above determinations.

Other features and advantages of the present invention will become apparent to one with skill in the art upon examination of the following drawings and detailed description. It is intended that all such additional features and advantages be included herein within the scope of the present invention.

BRIEF DESCRIPTION OF THE DRAWINGS

The invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIG. 6 is a table illustrating a relation between known information and a timing budget and a window duration;

FIG. 7 is a table illustrating characteristics of identified clock signals in relation to a reference clock.

DETAILED DESCRIPTION OF THE PREFERRED EMBODIMENT

The present invention seeks to overcome the shortcomings of typical static timing analysis tools for use in integrated circuit analysis and design. More particularly, the present invention provides for a timing analysis tool in which the cycle count needed along a signal path between a driver latch and a receiver latch of an integrated circuit to allow proper operation of intervening logic circuitry can be determined. The present invention provides for a timing analysis tool in which the cycle count needed between any two latches is determined by assigning an allowable timing budget based upon an ending clock output from an identified receiver circuitry block in relation to an input reference clock to an identified driver circuitry block. The present invention is applicable to signal paths in which both phase-type and pulse type clocks are used to clock latches under evaluation.

The present invention allows for static timing analysis to be conducted on any signal path between a driver latch and a receiver latch. More particularly, present invention allows for static timing analysis to determine whether or not any intervening logic gating located along the signal path between the output of the driver latch and the receiver latch is designed so as to function and allow data to flow between the driver latch and the receiver latch within the timing restrictions imposed by a receiving latch and the driving latch.

The present invention seeks to provide a static timing analysis tool in which a timing budget, or a number of clock cycles, between opening of a driving latch and closing of a receiving latch, is allotted for the circuit path under evaluation. The present invention also provides information identifying an available window during which the receiving latch is open and available to receive data from the driver circuit via intervening logic gating.

The erroneous effect of ambiguous clock signals is overcome in the present invention by assigning a timing budget to a signal path under analysis based upon four factors: 1) whether the driving latch opens on the trailing edge or leading edge of a defined reference clock; 2) whether the receiving latch is opening on the rising edge or trailing edge of an identified reference clock; 3) whether the receiving latch is closing on the rising edge or falling edge of the identified reference clock; and 4) what the relationship may be between the edge of the reference clock on which the receiver is opening and the reference edge on which the receiver is closing (i.e., opposite edge, same edge or next edge).

Figure 1:
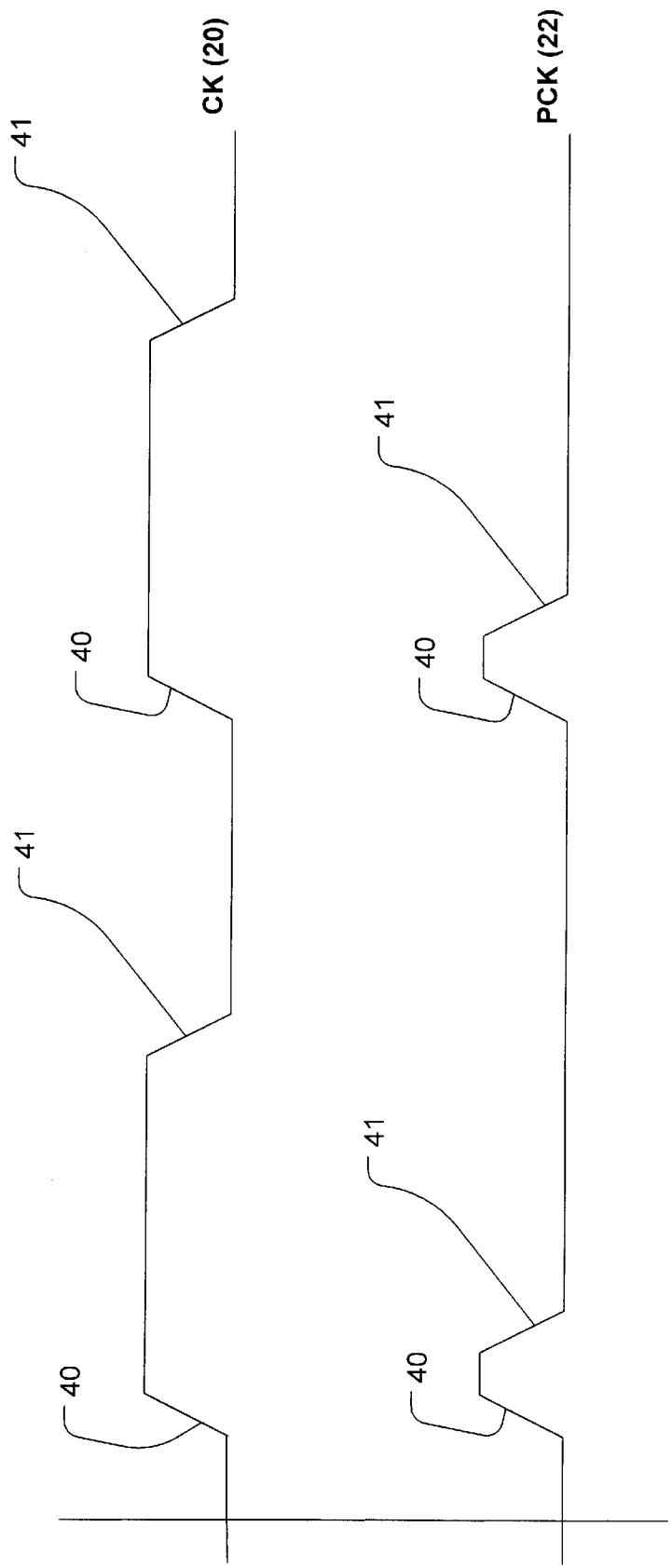
FIG. 1 is a diagram showing a phase clock signal and a pulse clock signal.
Figure 2:
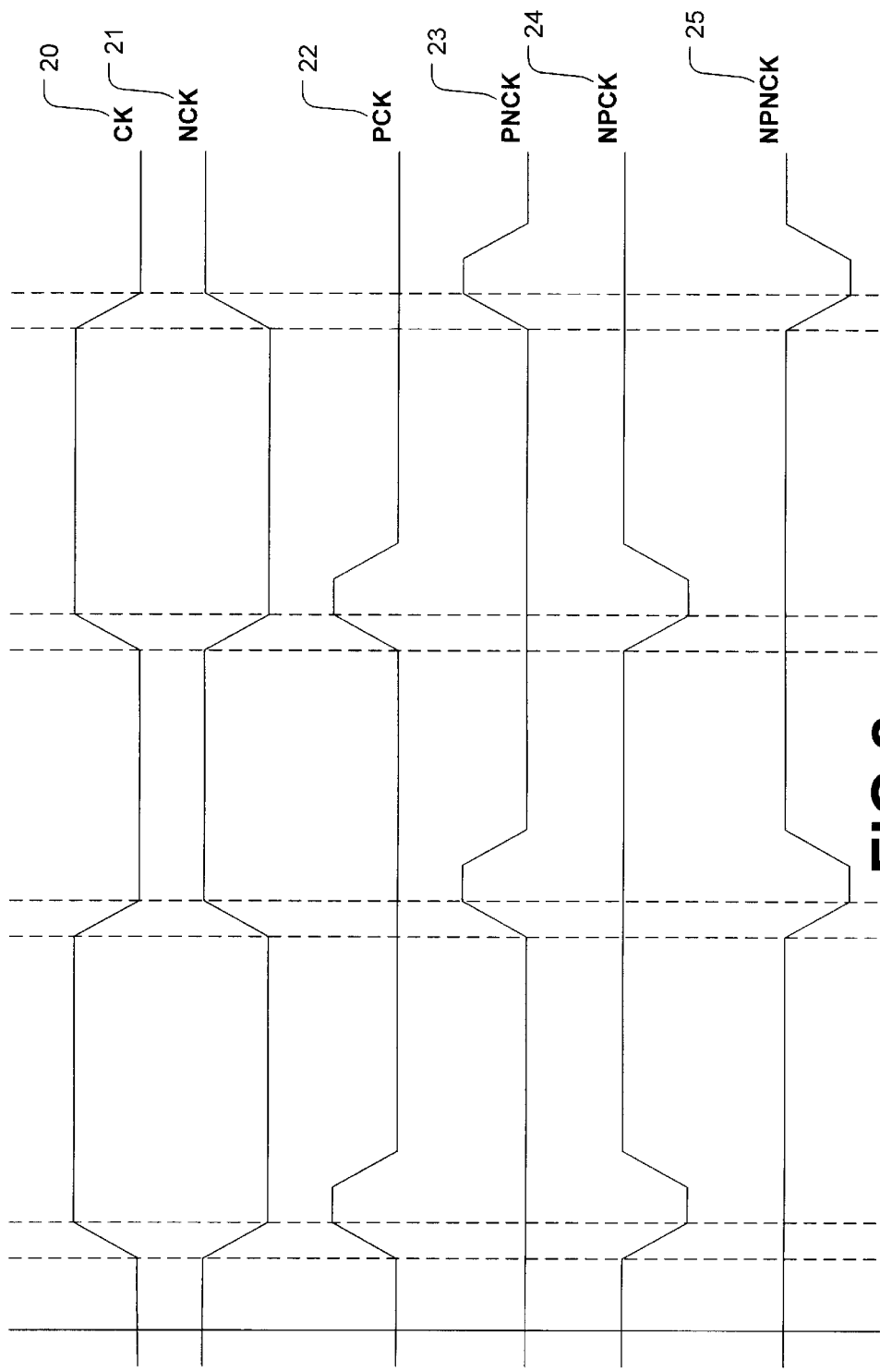
FIG. 2 is an illustration of various clock signals in relation to a phase clock signal.

With reference to FIG. 2, there is shown a diagram of several clock signals that may be provided for an integrated circuit. Each of these signals has an opening edge (leading edge) and a trailing edge. The respective response/timing of clock signal types is shown in relation to a each other. There is provided a phase clock signal (CK) 20, an inverted phase clock signal (NCK) 21, a pulse clock signal (PCK) 22, an opposite phase pulse clock signal (PNCK) 23, an inverted pulse clock signal (NPCK) 24 and an inverted opposite phase pulse clock signal (NPNCK) 25. Phase clocks have a duty cycle that is a fixed percentage of the reference clock period. A pulse type clock signal has a fixed duty cycle that is not contingent upon of the reference clock period. An inverted pulse type clock signal has a duty cycle equal to the period of the reference clock less a fixed delay equal to the pulse width.

Figure 3:
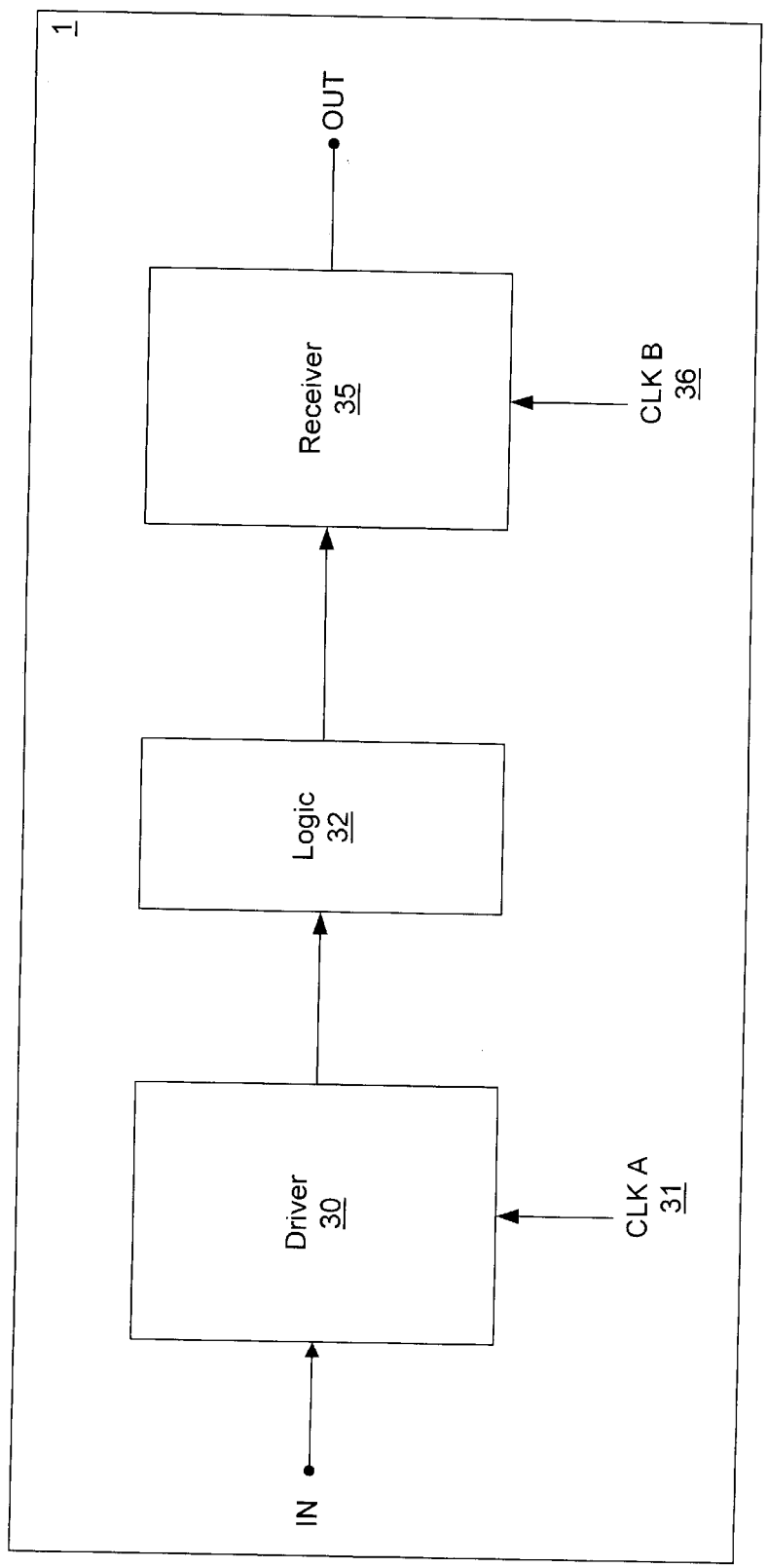
FIG. 3 is an illustration of an integrated circuit and signal path.

FIG. 3 shows an integrated circuit 1 which includes a signal path that includes circuitry block 30, circuitry block 32 and circuitry block 35. In this example, circuitry block 30 is a driver latch which drives circuitry block 32, and circuitry block 35 is a receiver latch which receives the output from circuitry block 32. Circuitry block 32 is a block of logic gating which connects the output of circuitry block 30 to the input of circuitry block 35. Circuitry blocks 30 and 35 receive a clock signal CLK A 31 and CLK B 36, respectively. Circuitry block 30 and circuitry block 35 can each be provided the same clock signal, the same type of clock signal, or different types of clock signals. For example, a phase-type clock signal could be provided to circuitry block 30 and a pulse type clock signal could be provided to circuitry block 35.

Depending upon the type of clock signal provided to the driver block 30 and the receiver block 35 the system of the present invention will refer to a look up table (LUT) 76 (FIG. 4) to determine the timing budget (or timing count) which should be allocated for signal path flow between the circuitry block 30 and the circuitry block 35. This timing budget indicates the amount of time (how many clock cycles) data input to driver 30 has to travel the signal path from the input of driver block 30 to the input of receiver block 35, via circuitry block 32, before receiver latch 35 closes and can not receive the input signal. This timing budget will be used by the system of the present invention to determine whether or not the circuitry under analysis will function properly. Likewise it will give the designer some indication that the timing is within design limitations and will function properly.

Figure 4:
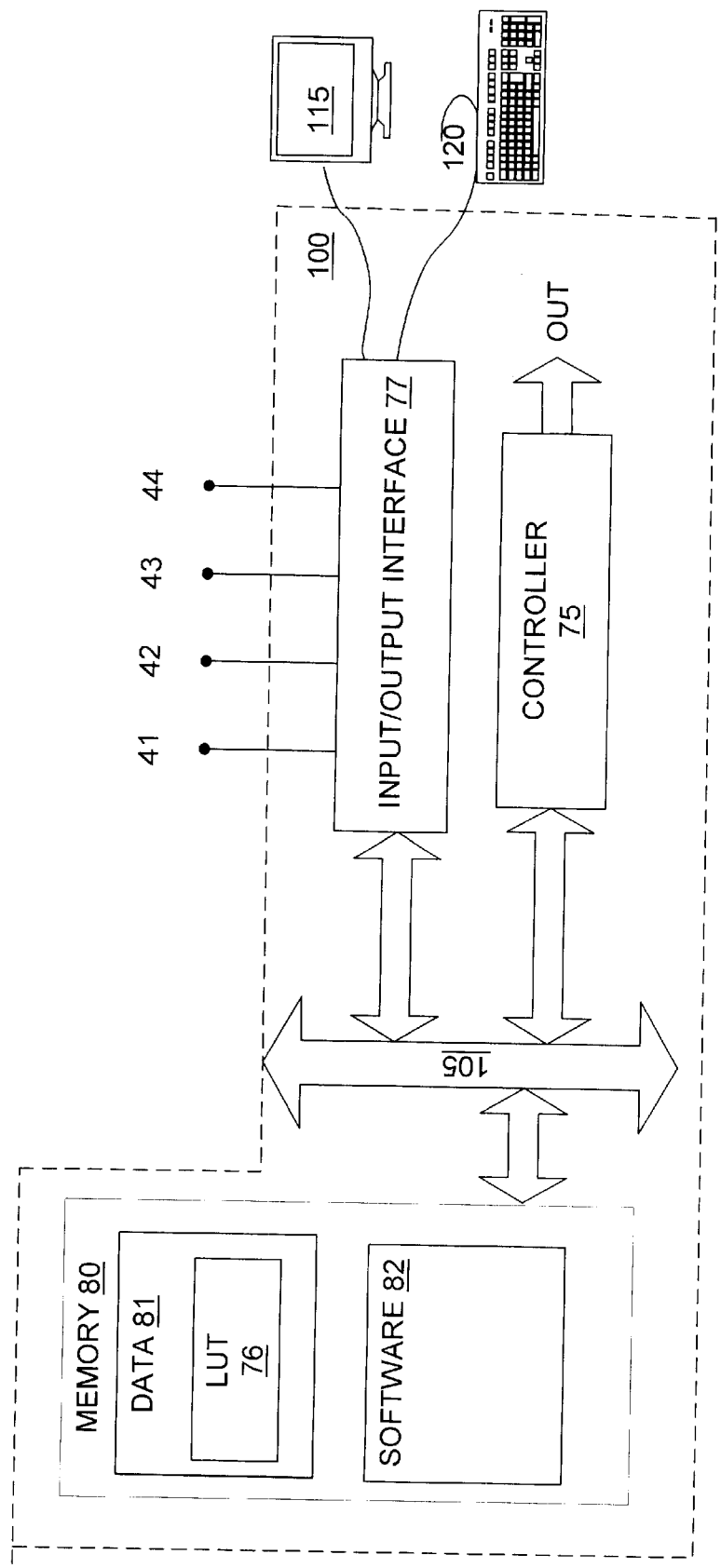
FIG. 4 is a block diagram illustrating one embodiment of the present invention.

FIG. 4 is a block diagram illustrating one embodiment of the present invention 100. There is provided an input/output interface 77 for receiving input of: 1) a first signal 41 representative of whether a driver latch opens on an opening edge or a trailing edge of a reference clock; 2) a second signal 42 representative of whether a receiver latch opens on a opening edge or a closing edge of the reference clock; 3) a third signal 43 representative of whether the receiver latch closes on an opening edge or a closing edge of the reference clock, and 4) a fourth signal 44 representative of a relationship between the reference clock edge on which the receiving latch opens and the reference clock edge on which the receiving latch closes. Input/Output interface 77 can be configured to provide for interfacing with, for example, a network (not shown), a display 115, and input devices such as a keyboard 120 and pointing device (not shown). The input signals (41, 42, 43 and 44) received via input/output interface 77 are provided to controller 75 via local interface 105. Controller 75 retrieves information from a LUT 76 stored in storage memory 80 based on the signals 41, 42, 43 and 44 in accordance with instructions stored on storage memory 80. More particularly, the controller 75 retrieves timing budget information from LUT 76. Storage memory 80 is preferably configured for storing electronic format instructions (software) 82 and content (data) 81. Storage memory 80 can include both volatile and non-volatile memory. Controller 75 controls and utilizes data stored in Look Up Table (LUT) 76 stored in storage memory 80 to assign a timing budget based upon the output signals from input/output interface 77 in accordance with the instructions (software code) stored on memory 82.

Data input signals 41, 42, 43 and 44 can be provided via a user input device, such as keyboard 120, or from data files stored on storage memory 80 and provided to controller 75. Controller 75 will then utilize data stored in Look Up Table (LUT) 76 stored in storage memory 80 to assign a timing budget based upon the data signals 41, 42, 43 and 44 entered from keyboard 120, or from circuit data files stored on memory 82 in accordance with the instructions (software code) stored on memory 82 which specify the method of the present invention.

The present invention provides a timing budget determined in accordance with cycle count data stored as a look up table (LUT) 76 in storage memory 80 as shown in FIG. 4. The timing budget specifies the number of phases of a predetermined reference clock that are necessary for data to be accurately and properly transferred from a driving latch to a receiving latch via intervening logic gating, which is under evaluation. This timing budget is then used to determine whether or not timing (cycle count) requirements are met. By utilizing timing budget information stored as a LUT 76, it is not necessary for manual insertion of commands into the static timing analysis tool of the present invention to be carried out for every latch to indicate how that part of the circuit under analysis should be timed, as with the typically known timing analysis tools.

Figure 5:
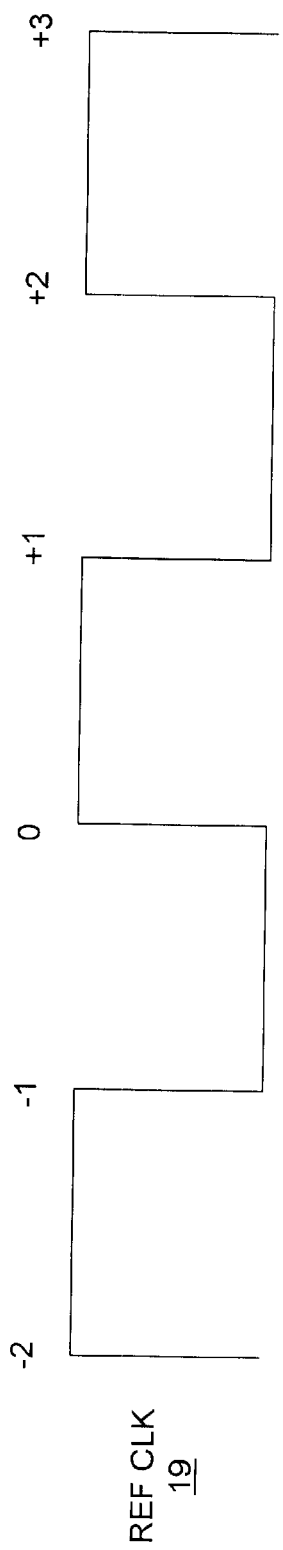
FIG. 5 is an illustration of a reference clock signal.

FIG. 5 illustrates a reference clock signal (REF-CLK) 19. Each phase of the REF-CK signal is numbered to conform to phase counts specified in FIG. 5 and further discussed below. With reference to FIG. 4, FIG. 5 and FIG. 6, a look up table (LUT) 76 is provided which specifies a timing budget allotment as well as the duration of a window (window duration) during which the receiving latch is open to receive data is provided. The timing budget as well as the window duration is linked to four (4) factors: 1) whether the driver latch is opening oil the leading edge or trailing edge of a defined reference clock; 2) whether the receiving latch is opening on the rising edge or trailing edge of an identified reference clock; 3) whether the receiving latch is closing on the rising edge or falling edge of the identified reference clock; and 4) what the relationship may be between the edge of the reference clock on which the receiver is opening and the reference edge on which the receiver is closing (i.e., opposite edge, same edge or next edge). By identifying these four factors, it is possible to define the clock utilized to clock receiving latch 35 in relation to the reference clock REF-CK 19. In this embodiment Input/Output interface 77 provides logic gating (sensors), which are configured to receive information relevant to these four factors.

FIG. 6 illustrates inputs, outputs and correlating timing occurrences relevant to the present invention. Columns I, II, III & IV correlate to input signals 41, 42 ,43 and 44 (FIG. 3) and show input information which identifies: 1) whether the driver latch is opening on the leading edge or trailing edge of a defined reference clock(Column I) 2) whether the receiving latch is opening on the rising edge or trailing edge of the reference clock (Column II); 3) the edge of the reference clock on which the receiver latch closes (column III); and 4) the relationship between the edge on which the receiver clock opens (as shown in column II) and the edge on which the receiver latch 35 closes (as shown in column III) (Column IV). More particularly, the column IV indicates whether the receiver is opening and closing on: 1) the "same" edge of the reference clock; 2) the "opposite" edge of the reference clock; or 3) the "next" edge of the reference clock.

Columns V, VI and VII show timing cycles which correlate to the various combinations of inputs identified in columns I, II, III and IV. It will be noted that some combinations of input have more than one set of correlating timing cycles. In this case, a user identifiable default is established. This default is indicated in column X as either same Reference Clock cycle (same RF) or next Reference Clock cycle (next RF). Unless, otherwise chosen by the user, the default will be used in determining budget and window duration.

Column VIII shows a timing budget available for each combination of inputs shown in columns II, III and IV. For input combinations which have more than one correlating set of timing cycles, the default shown in column X will determine which of the corresponding timing budgets will be allocated for a given input combination. Column IX shows the duration of the window during which the receiver latch is open to receive data.

As further explanation, the row 1 of FIG. 6 shows that when the receiver opens on the same edge as a reference clock and the receiver closes on the trailing (down) edge of the reference clock and the edge on which the receiver closes is the opposite of the edge on which the receiver opens, then there are two sets of correlating timing occurrences. These two sets of correlating timing occurrences are illustrated in rows 2, 4, 6, 8, 10 and 12 as two sets of numbers, a top set of numbers and a bottom set of numbers, shown in Columns V, VI, VII, VII, IX and X. The top set of numbers represents one occurrence, while the bottom set represents a second occurrence. These correlating timing occurrences are: 1) where the driver opens on during the "0" phase of the reference clock (column V, top set of numbers); 2) the receiver also opens during the "0" phase of the reference clock (column VI, top set of numbers); and 3) the receiver closes during the "+1" phase of the reference clock (column VII, top set of numbers). The bottom set of numbers of correlating timing occurrences correlates to where: 1) the driver opens on during the "0" phase of the reference clock (column V, bottom set of numbers); 2) the receiver also opens during the "+2" phase of the reference clock (column VI, bottom set of numbers); and 3) the receiver closes during the "+3" phase of the reference clock (column VII, bottom set of numbers). For the given set of inputs shown in row 1, a default-timing budget of +1 phases is allocated. A default window duration of +1 phases is also allocated.

With reference again to FIG. 2, the inputs and correlating timing occurrences set out in row 1 of FIG. 6 are shown. For example, where CK 20 represents the reference clock and PCK 22 represents the clock used to clock driver latch 30, and CK 20 is also used to clock the receiver latch 35, the timing relationship of the clock (PCK) applied to driver 30 and the clock (CK) applied to the receiver latch 35 in relation to the reference clock REF CLK can be seen. It will be noted that the relative timing and transitions of these clock signals corresponds to the timing occurrence information set out in columns V, VI and VII of FIG. 6.

FIG. 7 is a table illustrating some characteristics of identified clock types shown in FIG. 2 that may be provided to driver latch 30 and/or receiver latch 35 as clock signals CLK A 31 and CLK B 36, respectively. It is assumed that the defined reference clock is a phase-type clock signal (CK) clock signal. As an example, it can be seen that for a clock signal type CK applied to either the driver latch 30 or receiver latch 35, it will cause the appropriate latch to open on the rising or "up" edge (opening edge) of the reference clock. It can also be seen that for a phase-type clock (CK) applied to either driver latch 30 or receiver latch 35, the relevant latch will close on the down edge (closing edge) of the reference clock.

Figure 8:
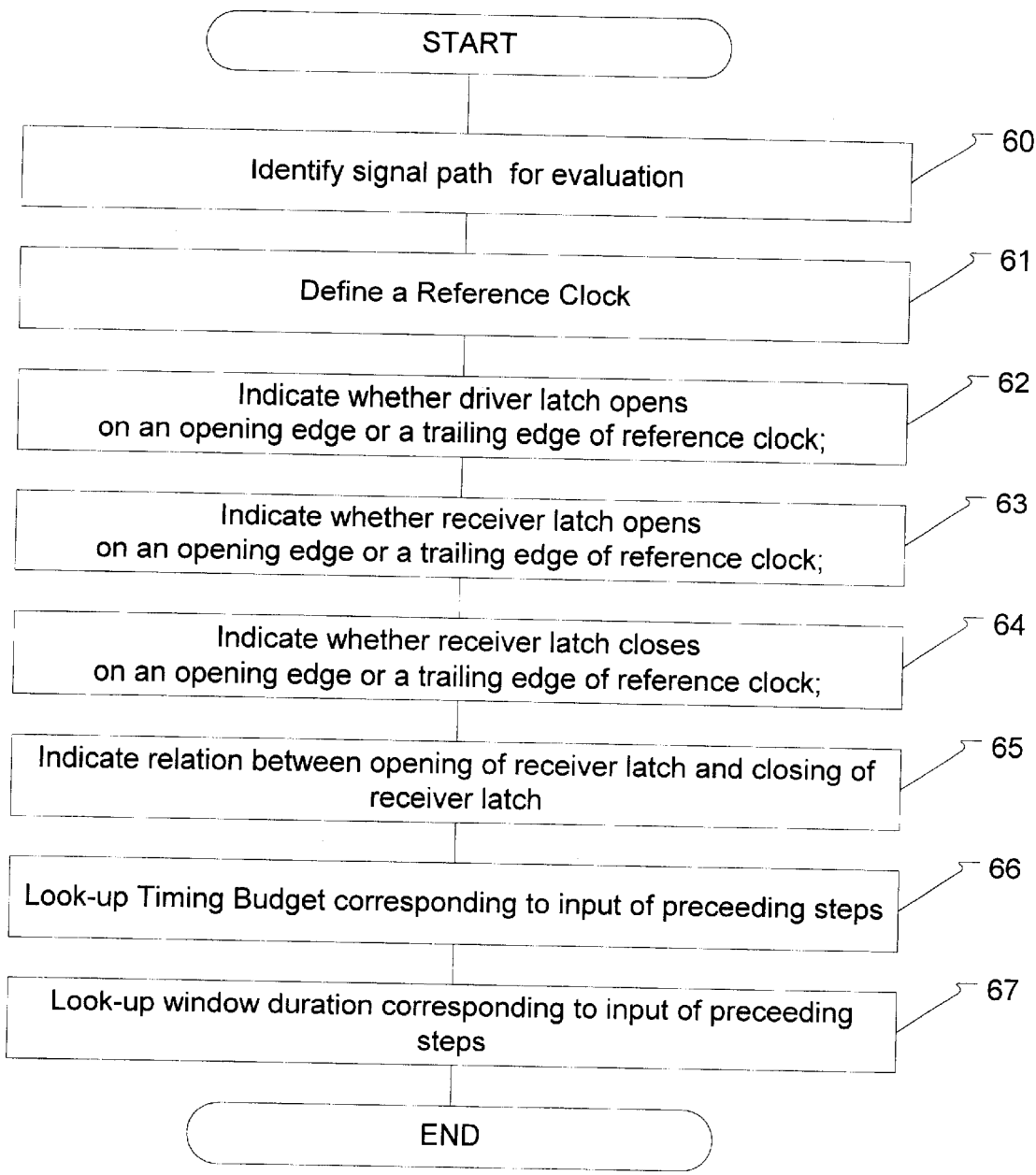
FIG. 8 is a flowchart illustrating the method of the present invention.

FIG. 8 is a flowchart describing the process of the present invention. It will be understood that the flow chart of FIG. 8 shows the architecture, functionality, and operation of a possible software implementation of the static timing analysis method of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIG. 8. For example, two blocks shown in succession in FIG. 8 may in fact be executed substantially concurrently or the blocks may sometimes be executed in the reverse order, depending upon the functionality involved, as will be further clarified hereinbelow.

A signal path defined by a driver latch 30 and a receiver latch 35 to be evaluated is identified at 60. A reference clock is defined 61. At 62, it is determined whether the driver latch opens on an opening edge or a trailing edge of the reference clock. At 63, it is determined whether the receiver latch opens on an opening edge or a trailing edge of the reference clock. At 64, it is determined whether the receiver latch closes on an opening edge or a trailing edge of the reference clock. At 65, a relation between the opening and closing of receiver latch is determined. At 66, a timing budget corresponding to the determinations of steps 62–64 is read-out from a look-up table. At 67, a window duration corresponding to the determinations of steps 62–64 is read-out from a look-up table. The look-up table will typically be stored in a memory device of some type.

The system of the present invention can be implemented in hardware, software, firmware, or a combination thereof. In the preferred embodiment(s), the organizational structure is implemented in software or firmware that is stored in a memory and that is executed by a suitable instruction execution system. If implemented in hardware, as in an alternative embodiment, the system of the present invention can implemented with any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

The static timing analysis method can be implemented as a program comprising an ordered listing of executable instructions for implementing logical functions, and can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (magnetic), a read-only memory (ROM) (magnetic), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

It should be emphasized that the above-described embodiments of the present invention, particularly, any "preferred" embodiments, are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

Therefore, having thus described the invention, at least the following is claimed:

1. A method of static timing analysis, comprising the steps of:
   identifying a signal path for evaluation;
   said signal path comprises a driver latch, logic gating and a receiver latch;
   defining a reference clock comprising an opening edge and closing edge;
   receiving a first input indicating whether the driver latch opens on an opening edge or a trailing edge of the reference clock;
   receiving a second input indicating whether the receiver latch opens on a opening edge or a closing edge of the reference clock;
   receiving a third input indicating whether the receiver latch closes on an opening edge or a closing edge of the reference clock;
   receiving a fourth input indicating the relationship between the reference clock edge on which the receiving latch opens and the reference clock edge on which the receiving latch closes; and
   assigning a timing budget based upon the first, second, third and fourth inputs.

2. A method of static timing analysis according to claim 1, further comprising the step of assigning a window duration based upon the first, second, third and fourth inputs.

3. A method of static timing analysis according to claim 1, wherein the step of assigning a timing budget comprises the step of reading out a timing budget from a look-up table.

4. A method of static timing analysis according to claim 2, wherein the step of assigning a window duration based upon the first, second, third and fourth inputs comprises a step of reading out, from a look-up table (LUT), a timing budget which corresponds to the first, second, third and fourth inputs.

5. A method of static timing analysis according to claim 3, wherein the timing budget read-out from the look-up table is selected based upon a predetermined default setting.

6. A method of static timing analysis according to claim 4, wherein the window duration read-out from the look-up table is selected based upon a predetermined default setting.

7. A method of static timing analysis comprising the steps of:
   identifying a signal path for evaluation, wherein said signal path comprises a driver latch, logic gating and a receiver latch;
   defining a reference clock comprising an opening edge and closing edge;
   defining characteristics of a driver clock used to clock the driver latch and a receiver clock used to clock the receiver latch; and
   assigning a timing budget by correlating the characteristics of the clocks with information stored in a look-up table (LUT).

8. A method of static timing analysis according to claim 7, wherein the step of defining characteristics of the driver clock and the receiver clock comprises the steps of:

determining whether the driver latch opens on an opening edge or a trailing edge of the reference clock;

determining whether the receiver latch opens on an opening edge or a closing edge of the reference clock;

determining whether the receiver latch closes on an opening edge or a closing edge of the reference clock; and determining the relationship between the reference clock edge on which the receiving latch opens and the reference clock edge on which the receiving latch closes.

9. A method of static timing analysis according to claim 7, further comprising the step of assigning a window duration by correlating the characteristics of the clocks with information stored in a look up table.

10. A method of static timing analysis according to claim 8, further comprising the step of assigning a window duration by correlating the characteristics of the clocks with information stored in a look-up table.

11. A method of static timing analysis according to claim 9, wherein the look-up table is stored in a memory device.

12. A system for static timing analysis comprising:

a first sensor for determining whether a driver latch opens on an opening edge or a trailing edge of a reference clock;

a second sensor for determining whether a receiver latch opens on an opening edge or a closing edge of the reference clock;

a third sensor for determining whether the receiver latch closes on an opening edge or a closing edge of the reference clock;

a fourth sensor for determining a the relationship between the reference clock edge on which the receiving latch opens and the reference clock edge on which the receiving latch closes; and a controller for assigning a timing budget based upon the determinations of the first, second, third and fourth sensors.

13. A system for static timing analysis according to claim 12, wherein the controller determines a window duration.

14. A system for static timing analysis according to claim 13, wherein the controller determines the window duration by referring to a look-up table.

15. A system for static timing analysis according to claim 14, wherein the look-up table is stored in a memory device.

16. A system for static timing analysis according to claim 12, wherein the first, second, third and fourth sensors each comprise logic circuitry and supporting software code.

17. A system for static timing analysis, comprising:

first means for determining and outputting whether a driver latch opens on an opening edge or a trailing edge of a reference clock;

second means for determining and outputting whether a receiver latch opens on a opening edge or a closing edge of the reference clock;

third means for determining and outputting whether the receiver latch closes on an opening edge or a closing edge of the reference clock;

fourth means for determining and outputting a signal representative of a relationship between the reference clock edge on which the receiving latch opens and the reference clock edge on which the receiving latch closes; and controller means for assigning a timing budget based upon the first, second, third and fourth outputs.

18. A system for static timing analysis according to claim 17, wherein the controller means comprises a central processing unit (CPU).

19. A system for static timing analysis according to claim 17, wherein the first, second, third and fourth means for determining comprise logic gating.

20. A system for static timing analysis according to claim 16, wherein the system comprises a computer.

21. A system for static timing analysis according to claim 16, wherein the system further comprises a memory device for storing look-up table data.

22. A system for static timing analysis of a signal path comprising a driver latch, receiver latch and intervening circuitry, the system comprising:

a processor electrically coupled to a local interface;

a memory electrically coupled to the local interface;

a look-up Table (LUT) stored on the memory, specifying timing budget in relation to predefined clock signal relationships;

operating logic, stored on the memory and executable by the processor, comprising:

logic to receive a first input representative of whether the driver latch opens on an opening edge or a trailing edge of a reference clock;

logic to receive a second input indicating whether the receiver latch opens on a opening edge or a closing edge of the reference clock;

logic to receive a third input indicating whether the receiver latch closes on an opening edge or a closing edge of the reference clock;

logic to receive a fourth input indicating the relationship between a reference clock edge on which the receiving latch opens and a reference clock edge on which the receiving latch closes; and logic for assigning a timing budget based upon the first, second, third and fourth inputs.

23. A system for static timing analysis, comprising:

first input for receiving a first signal representative of whether a driver latch opens on an opening edge or a trailing edge of a reference clock;

second input for receiving a second signal representative of whether a receiver latch opens on a opening edge or a closing edge of the reference clock;

third input for receiving a third signal representative of whether the receiver latch closes on an opening edge or a closing edge of the reference clock;

fourth input for receiving a fourth signal representative of a relationship between the reference clock edge on which the receiving latch opens and the reference clock edge on which the receiving latch closes; and controller for assigning a timing budget by referring to a look up table, based upon said first, second, third and fourth signals.

24. A system for static timing analysis according to claim 23, wherein said first, second, third and fourth inputs comprise a input/output interface.

25. A system for static timing analysis according to claim 23, wherein said first, second, third and fourth signals are derived from data stored in a memory storage device.

26. A system for static timing analysis according to claim 23, wherein said first, second, third and fourth signals are derived from logic gating.

* * * * *